United States Patent [19]
Howell

[11] Patent Number: 5,815,374
[45] Date of Patent: Sep. 29, 1998

[54] METHOD AND APPARATUS FOR REDIRECTING CERTAIN INPUT/OUTPUT CONNECTIONS OF INTEGRATED CIRCUIT CHIP CONFIGURATIONS

[75] Inventor: Wayne John Howell, Williston, Vt.

[73] Assignee: International Business Machines Corporation, Armonk, N.Y.

[21] Appl. No.: 722,717

[22] Filed: Sep. 30, 1996

[51] Int. Cl.[6] .................................................. H05K 7/02
[52] U.S. Cl. ........................ 361/768; 361/777; 361/778; 361/790; 361/803; 174/262; 257/698
[58] Field of Search .................................. 361/735, 736, 361/767, 768, 777, 778, 790, 803; 439/68, 69, 71; 257/686, 777, 698; 174/260, 261, 262

[56] References Cited

U.S. PATENT DOCUMENTS

| | | | |
|---|---|---|---|
| 4,574,331 | 3/1986 | Smolley | 361/735 |
| 4,727,410 | 2/1988 | Higgins, III | 257/700 |
| 4,813,129 | 3/1989 | Karnezos | 29/832 |
| 5,007,841 | 4/1991 | Smolley | 439/66 |
| 5,016,138 | 5/1991 | Woodman | 361/688 |
| 5,039,628 | 8/1991 | Carey | 29/832 |
| 5,051,865 | 9/1991 | Kato | 257/686 |
| 5,177,594 | 1/1993 | Chance et al. | 257/678 |
| 5,224,918 | 7/1993 | Neumann et al. | 29/885 |
| 5,252,857 | 10/1993 | Kane et al. | 257/686 |
| 5,281,852 | 1/1994 | Normington | 257/686 |
| 5,311,401 | 5/1994 | Gates, Jr. et al. | 367/760 |
| 5,327,327 | 7/1994 | Frew et al. | 361/784 |
| 5,343,075 | 8/1994 | Nishino | 357/686 |
| 5,414,637 | 5/1995 | Bertin | 364/489 |
| 5,432,729 | 7/1995 | Carson et al. | 257/686 |
| 5,434,745 | 7/1995 | Shokrogozar et al. | 361/735 |
| 5,477,933 | 12/1995 | Nguyen | 361/790 |
| 5,483,421 | 1/1996 | Gedney et al. | 361/792 |

*Primary Examiner*—Leo P. Picard
*Assistant Examiner*—John B. Vigushin
*Attorney, Agent, or Firm*—Calfee, Halter & Griswold LLP

[57] ABSTRACT

A technique is provided for correcting miswiring on a chip for test purposes. When an IC chip has been formed during a prototype operation, often I/O wiring is found to be deficient. This deficiency can be corrected by providing an interposer which has pads on one surface corresponding to the pads on the IC chip and pads on the opposite surface of the interposer corresponding to the desired output connections. Vias are formed through the interposer and the miswired connections on the chip surface are wired through the vias to the proper connections for the output of the chip as well as the proper connections on the chip being wired to the proper connections for the output connection on the opposite surface of the interposer.

11 Claims, 6 Drawing Sheets

METHOD AND APPARATUS FOR REDIRECTING CERTAIN INPUT/OUTPUT CONNECTIONS OF INTEGRATED CIRCUIT CHIP CONFIGURATIONS

RELATED APPLICATION

Application Ser. No. 08/719,826, filed concurrently herewith, entitled "Method and Apparatus for Directing the Input/Output Connection of Integrated Circuit Chip Cube Configurations," (Attorney Docket No. EN9-95-124).

FIELD OF THE INVENTION

This invention relates generally to the packaging of integrated circuit (IC) chips, and more particularly in one embodiment to the packaging of IC chips in a so-called chip cube or stacked configuration. In more particular aspects of this embodiment, this invention relates to a technique for providing a chip cube or stacked structure which allows for sparing of chips to assure that there are sufficient chips and connections therefor for providing a fully operative chip cube or stacked structure. In another embodiment, this invention provides for the formation and use of a customized interface to correct and test for wiring design defects in single IC chips.

BACKGROUND ART

In the packaging of IC chips, and particularly memory chips, one technique that is used is forming the so-called "chip cube" or "chip stack." In this technique, a series of IC chips is provided, each of which chips has outputs on the face thereof which outputs are brought to one edge of each of the chip. The chips are then joined in a front-to-back relationship in such a manner that the edges of the chips which have the electrical contacts or leads terminating thereon form one face of the chip "cube" or "stack". (It should be understood that the term "chip cube" is not limited to a solid shape that is cubical having six square faces, but can refer to other solid parallelpipeds where the faces are rectangular or, indeed, other parallelograms.)

The chip cube is then mounted on some type of a substrate by solder ball or other suitable connections between the exposed contacts on the cube face and pads on the substrate. In such a case, the input/output pads on each chip are arranged in sets so that each set of inputs and outputs to any given chip are similarly arranged to the sets of inputs and outputs of any other chip. Thus, a compact structure of IC chips, especially memory chips, is provided which, when mounted onto a substrate, provides a high density memory structure.

One of the problems encountered, however, is that even though all of the chips utilized to form the cube or stack have been tested as "good" chips, nevertheless, once the chips have been formed into the stack, additional stressing (i.e., burn-in) of the chips may result in chip electrical functionality failure. The burn-in procedure is a procedure wherein the chips, once assembled, are exercised at elevated temperatures and/or voltages which will induce chips to fail, which chips would otherwise be prone to early failure. This burn-in procedure also will detect any problems created by adding the additional circuitry to bring the leads of the chips out to the edge and the bonding and other assembly operations for forming the chip cube. Hence, it is not uncommon for one or more chips to fail during this burn-in procedure. If in the chip cube or chip stack there are merely the exact number of chips for the part as required for functioning, the failure of any one chip can result in the failure of the entire part. Because of the nature of the joining of the chips together, reworking is generally not a viable option, and thus the entire stack of chips would have to be discarded if even just one of the chips were inoperative or had failed.

To overcome this problem, a technique known as "sparing" has been adopted in which more than the required number of chips are formed into the chip stack and, after burn-in when the functioning chips and the failed chips have been identified, the number of functioning chips required can be custom-wired to provide the necessary connections. This technique, however, has not proved entirely satisfactory since most of the custom-wiring techniques have required very thin line circuit traces being formed on the face of the chip cube or, alternatively, on layers of dielectric formed over the chip cube face to form the connection. By forming a layer of dielectric on the chip cube face, thin film polyimide edge beading and other problems have contributed to a significant problem in providing the required wiring.

In a related field, i.e., the design and testing of prototype single IC chips, the usual procedure is to design the chip, including the IC wiring of the chip, and then produce a prototype of the chip. In the testing of the prototype chip, errors in wiring are frequently detected. In the past, this has necessitated fabricating a new chip with the detected errors corrected and then retesting the chip. This is time-consuming and expensive. Alternatively, correction has been attempted by trying to manually rewire the chip, which is difficult and has met with only limited success.

SUMMARY OF THE INVENTION

According to the present invention, in one embodiment a technique is provided for forming a chip cube or stack made up of a plurality of chips laminated together in front-to-back relationship with the edges of the chips forming a cube face having a set of connectors for each chip thereon. The number of functional chips required for operation is defined as X and the number of chips provided in the stack is equal to X+Y where X and Y are whole number integers such that there is a selected number of chips greater than the number of functioning chips required in the stack. If any number of the chips equal to Y or less are found to be defective as a result of burn-in, there are still enough of the remaining chips available to perform the required function of the stack. Thereafter, X number of the good chips are connected to output circuitry through an interposer. The interposer is provided with contact pads for each set of contacts on all of the IC chips (X+Y) on one side of the interposer, and outlet pads are provided on the opposite side of the interposer, there being X sets of outlet pads. Also provided in the interposer is a number of sets of vias at least equal to the number of outlet pads. The chips are all exercised in a burn-in procedure after they have been assembled into a chip stack. If there are sufficient number of functioning chips after burn-in, the interposer is custom-wired to connect X number of sets of chip pads and the outlet pads through the vias. The chip stack is then mounted on the interposer, preferably by solder ball connection technology wherein all of the contacts on the cube face are connected to all of the chip mounting pads on the interposer, but only those which have been selected for functioning chips are connected through the vias and the outlet pads to provide input/output capabilities for the chip stack.

In another embodiment, a new design or prototype chip which was fabricated, tested and some I/O wiring found deficient, has the I/O wiring corrected by providing an interposer to correct the wiring pattern thereon. The interposer is mechanically and electrically connected to the chips. Bond pads on the interposer are arrayed like the bond pads on the chip to provide input/output signals to the interposer and thus to the chip.

DESCRIPTION OF THE PREFERRED EMBODIMENT(S)

Figure 1:
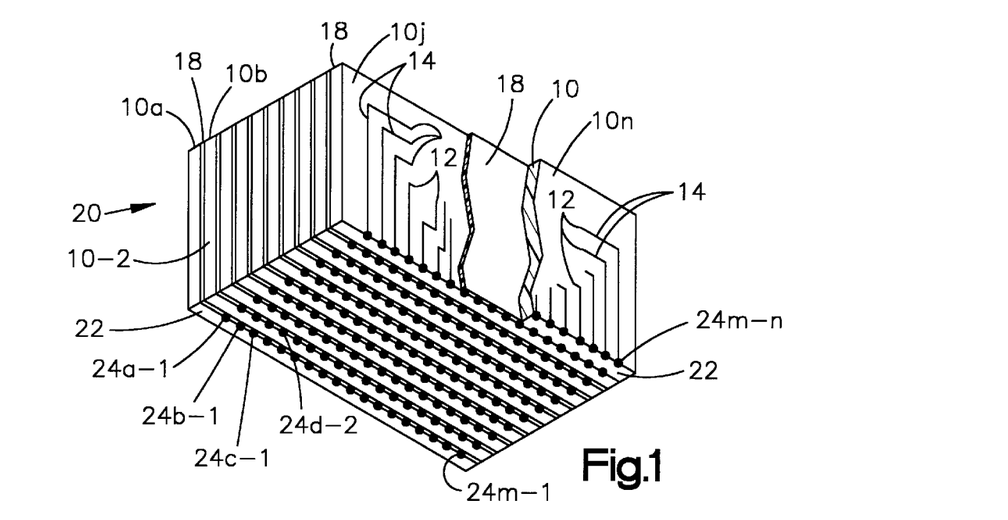
FIG. 1 is a perspective view of several IC chips forming a stack according to this invention.

Referring now to the drawings, and for the present to FIG. 1, a perspective view of a portion of a chip cube is shown partially in section with parts broken away for clarity. In essence, the chip cube is formed of a plurality of integrated circuit chips 10, each of which is formed with a conventional footprint comprised of a plurality of input/output (I/O) connections 12 thereon. (To distinguish between various chips, a numbering convention has been adopted to refer, when necessary, to specific chips as 10-1, 10-2 . . . 10-n, "n" designating the last number in the series.) The I/O connections 12 have circuit lines 14 leading therefrom to one edge of the chip 10. The chips 10 are secured together in front-to-back relationship by means of thin films of adhesive 18 which form the chips generally into a stack or cube. The chips 10-1 through 10-n are arranged so that the circuitry 14 terminates at a connector surface 22 on the cube 20, at which the circuitry 14 terminates and forms an array of connections 24 thereon. To designate the various connections on a given chip 10, the connections are designated as 24a, 24b . . . 24m (in this case, "m" designates an end number in a series). Thus, a given connection or a particular chip would be designated, e.g., connection 24a-1, or 24b-3, etc. As was indicated earlier, all of the chips 10-1 to 10-n are tested prior to formation into the cube 20, but the chips are not burned in until after they are formed into the cube 20. When the chips are burned in, one or more of the chips may fail; i.e., one or more of the connections 24a–24m on any one chip 10 may fail to perform during testing. If the cube were arranged to include just enough chips to satisfy the connection requirements to a substrate, as will be explained presently, and one of the chips failed or indeed one connection 24 on one chip 10 failed, the entire cube would be inoperative and would have to be scrapped since typically every connection is required to operate. Therefore, it is common practice to provide more chips in the cube than are necessary to form the connections. For example, and just by way of example and not by limitation, it may be necessary to utilize 20 operative or functioning chips to provide the necessary connections to form a chip cube. In such case, and to ensure that after burn-in there is a high probability of there being at least 20 operative chips, an excess number of chips are bonded to form the cube, e.g., twenty-four chips could be used and bonded to form the cube, from which, in all probability, at least twenty chips 10 would be good. The challenge, then, is to provide an outlet or external connection to the cube after burn-in that will provide the necessary connection to the substrate which will be common to the substrate irrespective of which twenty chips are functional and functioning, and irrespective of which chips, if any, fail, and which external connection will have a common pattern of outlets required. At this point, it should be noted that each of the chips is substantially identical in construction, and the chips are completely interchangeable, one with the other; i.e., any twenty chips can be used, and any one chip can substitute for any other chip.

Figure 2:
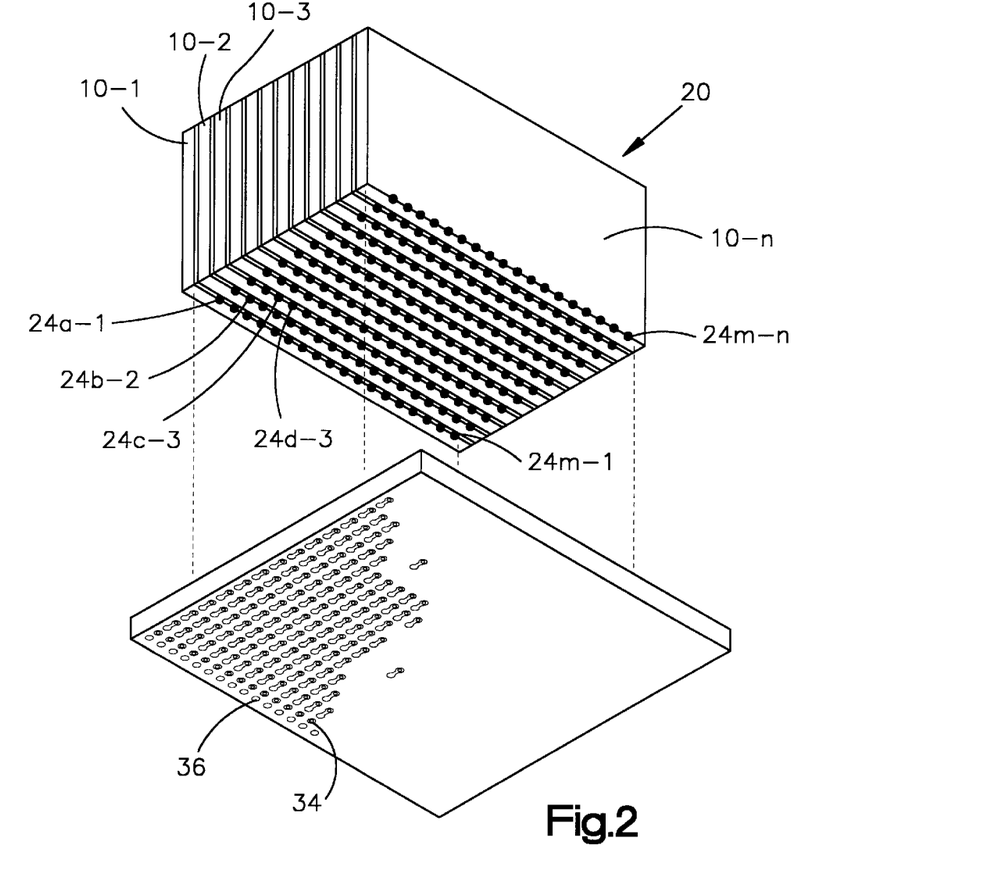
FIG. 2 is an exploded view of the chip stack and interposer according to this invention.
Figure 3:
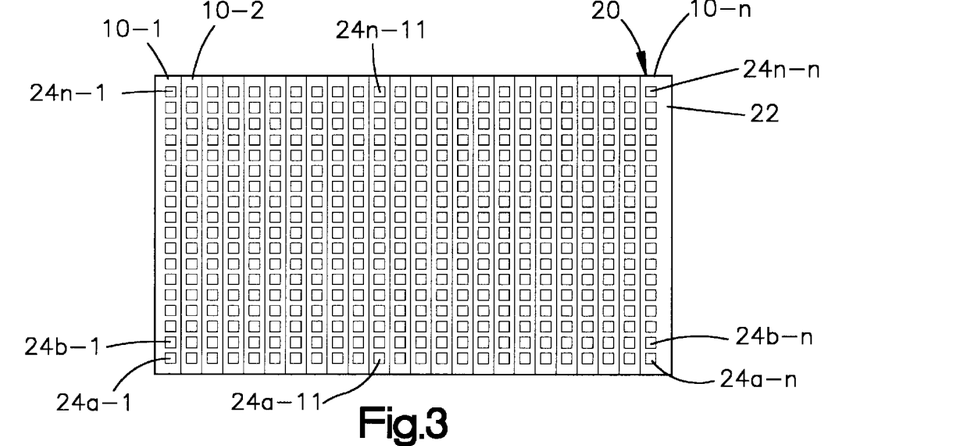
FIG. 3 is a bottom plan view of the face of the chip cube having the chip contacts thereon.
Figure 4:
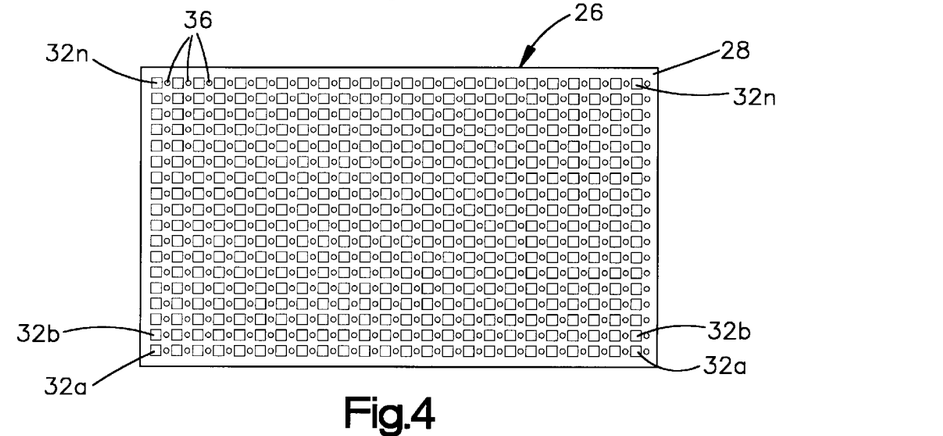
FIG. 4 is an X-ray top plan view of the cube mounting face of an interposer for use in connecting IC chips.
Figure 5:
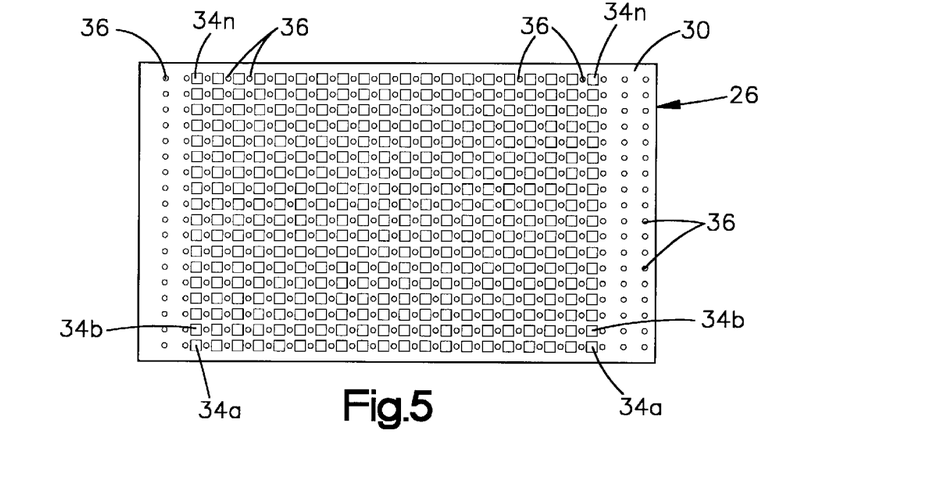
FIG. 5 is a bottom plan view of the output face of the interposer of FIG. 4.

In order to accomplish this purpose of allowing any of the twenty of the twenty-four chips 10 to function, an interposer 26 is provided which is formed of a dielectric material such as composite reinforced polytetrafluoroethylene (PTFE) or polyimide. As shown in FIGS. 2, 4 and 5, the interposer has a cube mounting surface 28 and an output surface 30. The cube mounting surface 28 has an array of chip attachment pads 32 thereon, which correspond in number and location to the connector pads 24 on the face 22 of the cube 20. Thus, there is provided on the cube mounting surface 28 of the interposer 26 a number of pads which are located so that all of the connectors 24a–24m on all of the chips 10-1 through 10-n can be connected to the chip attachment pads 32; i.e., the pads 24a–24m of each of the twenty-four chips 10-1 through 10-24 has a corresponding attachment pad 32a–32m on the surface 28 of the interposer 26.

The output surface 30 of the interposer 26 is provided with a series of output pads 34a–34m, which correspond in location and number to the number of connections which need to be made; i.e., if twenty chips are to be functional, there will be twenty sets of pads 34a–34m. As indicated above, these pads 34a–34m will correspond in location and number to the number of connections required for the I/Os of the cube in its functional environment. It then becomes necessary to identify the functioning chips in the cube. There must be enough functioning chips in the cube to meet the requirements of all of the I/O pads 34a–34m. In the example used, there must be twenty functioning chips, or expressed another way, there can be no more than 4 non-functioning chips. In a more general sense, this can be expressed as a chip array or cube having X+Y number of chips wherein X and Y are positive integers and wherein there must be at least X number of functioning chips (i.e., a chip where all connections 24a–24m of the chip work). Thus, as indicated in the example chosen, there must be at least twenty functioning chips, and hence, no more than four non-functioning chips.

Assuming that there are at least enough functioning chips to fulfill the requirement of X functioning chips, which in the case being described is that there are at least twenty functioning chips, the interposer is then wired to connect a selected twenty functioning chips to the twenty rows of chip output pads 34a–34m on the output surface 30. This is done by means of wiring the chip attachments pads 32a–32m to the output pads 34a–34m through vias 36 formed in the interposer, each of the vias extending from the chip mounting surface 28 to the output surface 30. These vias 36 are preferably in the form of plated through holes, and thus surface wiring on either the output surface 30 or the cube mounting surface 28, or both, can be used to attach the connection 24a–24m of each of the functioning chips to the output pads 34a–34m.

Figure 6:
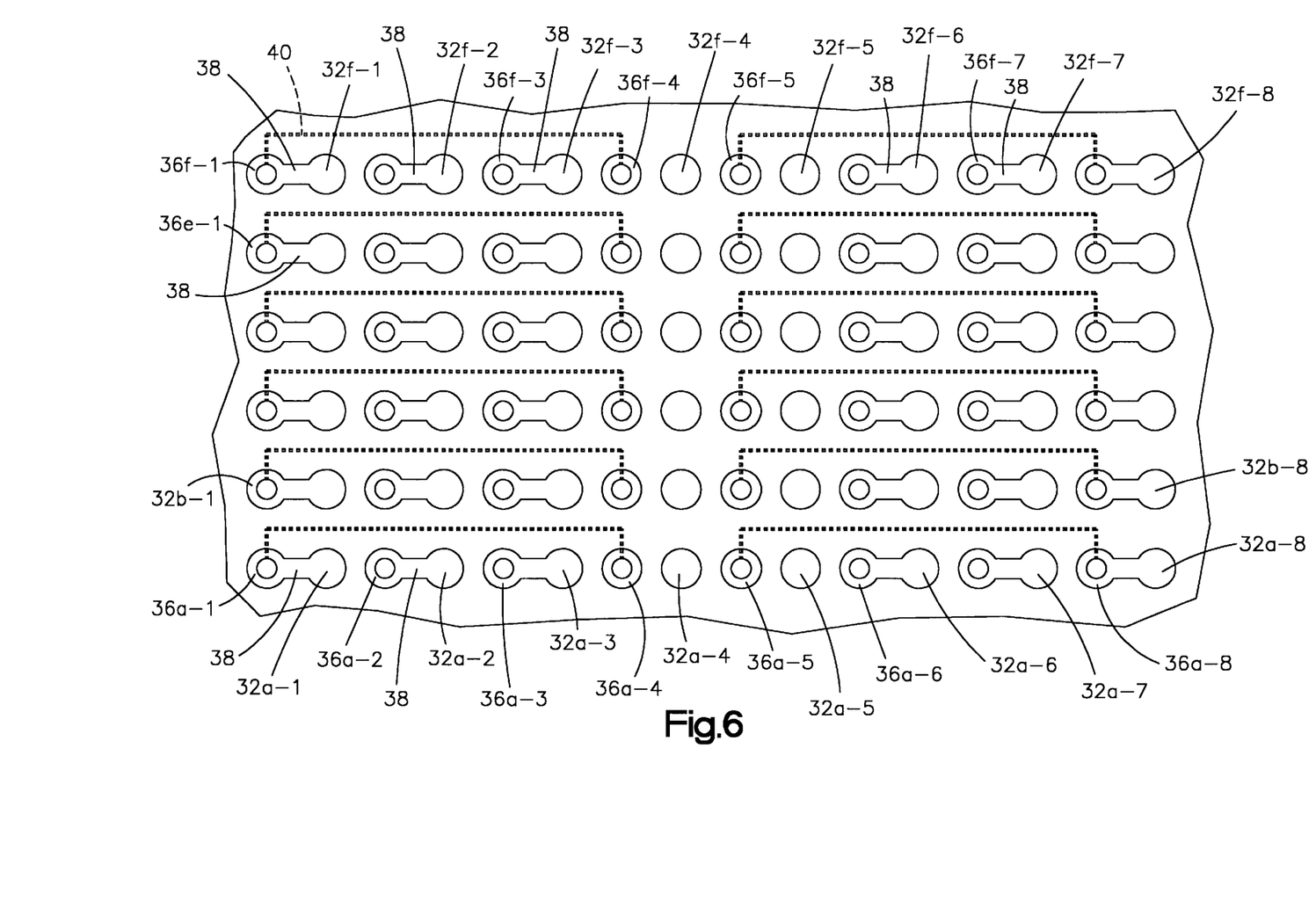
FIG. 6 is a top plan view of a portion of the cube mounting face of the interposer showing customized electrical connections.
Figure 7:
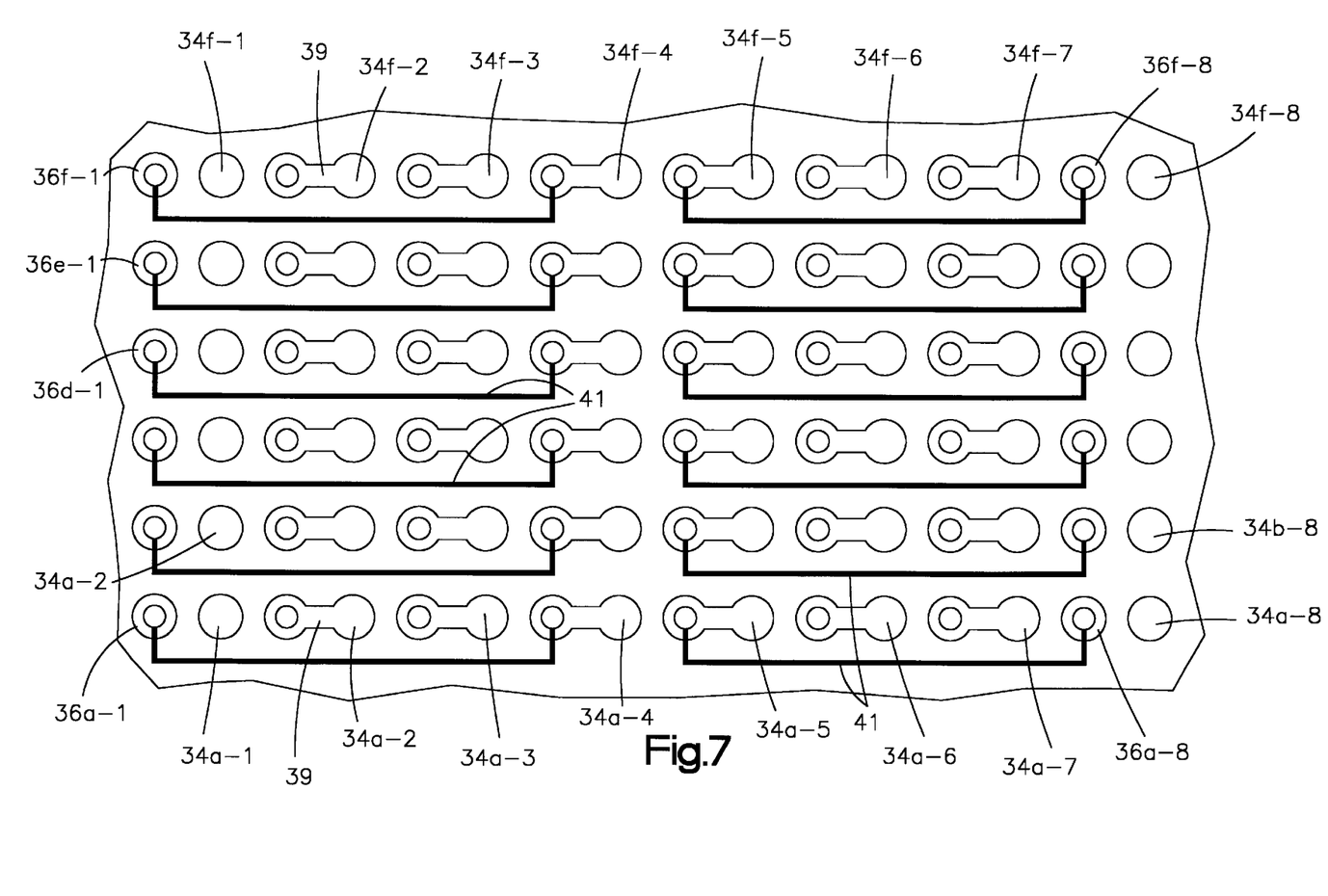
FIG. 7 is an X-ray bottom plan view of a portion of the interposer showing custom circuitization.

One technique for wiring the chips is shown in FIGS. 6 and 7. In this technique, the top and bottom surfaces of the interposer 20 are used as wiring channels to selectively wire the selected functioning chips to the output pads 34a–34m on the bottom surface of the interposer. (It is to be understood that FIGS. 6 and 7 are somewhat schematic and show somewhat diagrammatically the technique of wiring just a few chips of the array, it being understood that this technique applies to all of the chips and on all connection sites on each chip.) In this case, it is desired to wire the chip which is bonded to the pads 32a-1 through 32m-1 around some pads to outlet pads 34a-4 to 34m-4, and to wire the chip attached to the pads 32a-8 through 32m-8 to outlet pads 34a-5 to 34m-5; the chips attached to 32a-2 to 32m-2 are wired to pads 34a-2 to 34m-2; the chips connected to pads 32a-3 to 32m-3 are wired to pads 34a-3 to 34m-3; the chips wired to 32a-6 through 32m-6 are wired to pads 34a-6 to 34m-6; and chips attached to pads 32a-7 through 32m-7 are wired to pads 34a-7 to 34m-7. In this scheme, the chips attached to pads 32a-4 through 32m-4 and 32a-5 through 32m-5 have been "deselected," i.e., due to some defect or other reason, they are not functioning chips, even though they are to be connected to their respected pads 32a-4 to 32m-4 and 32a-5 through 32m-5. In this scheme, each of the pads 32a-1 to 32m-1, 32a-2 to 32m-2, 32a-3 to 32m-3, 32a-6 to 32m-6 and 32a-7 to 32m-7 are connected by circuit traces 38 to their next adjacent via 36 as seen in FIG. 6. Similarly, the pads 34a-2 to 34m-2, 34a-3 to 34m-3, 34a-4 to 34m-4, 34a-5 to 34m-5, 34a-6 to 34m-6, and 34a-7 to 34m-7 are also connected to their next adjacent vias 36 by circuit traces 39 on the bottom. By the wiring on the surface 28 of the interposer 20, the pads 32a-1 through 32m-1 are connected to their adjacent vias 36, which in turn are connected to vias 36 by surface wiring 40 on surface 28, and which vias 36 on the bottom surface 30 are connected to pads 34a-4 through 34m-4 by traces 39. Thus, this effectively connects the chip that is connected to the pads 32a-1 through 32m-1 around some pads to the pads 34a-4 through 34m-4 for output. Similarly, the chip connected to pads 32a-8 through 32m-8 is connected through via 36 adjacent thereto to the vias on the bottom adjacent to pads 34a-5 through 34m-5 by surface wiring 41 on surface 30, thus effectively connecting the chips that are connected to the pads 32a-8 through 32m-8 to the pads 34a-5 through 34m-5. Thus, the chip footprint connected on the bottom represents pads 34a-2 through 34m-2, 34a-3 through 34m-3, 34a-4 through 34m-4, 34a-5 through 34m-5, 34a-6 through 34m-6 and 34a-7 through 34m-7. These are the pads then that are soldered by solder ball connection 44 (see FIG. 8) or otherwise joined to a substrate to form the connection to the chips, which chips are soldered or otherwise connected to the pads 32. Hence, irrespective of which chips are functional that are attached to pads 32 by providing circuitry using the channels on the surfaces 28 and 30 of the interposer, appropriate wiring can be provided to connect any chip in the array of good chips to provide the required output to the pads below. Thus, if there is an array of twenty-four chips and twenty good chips are required, any twenty good chips will suffice to provide the same output footprint on the pads 34 irrespective of which twenty chips are functional.

Figure 8:
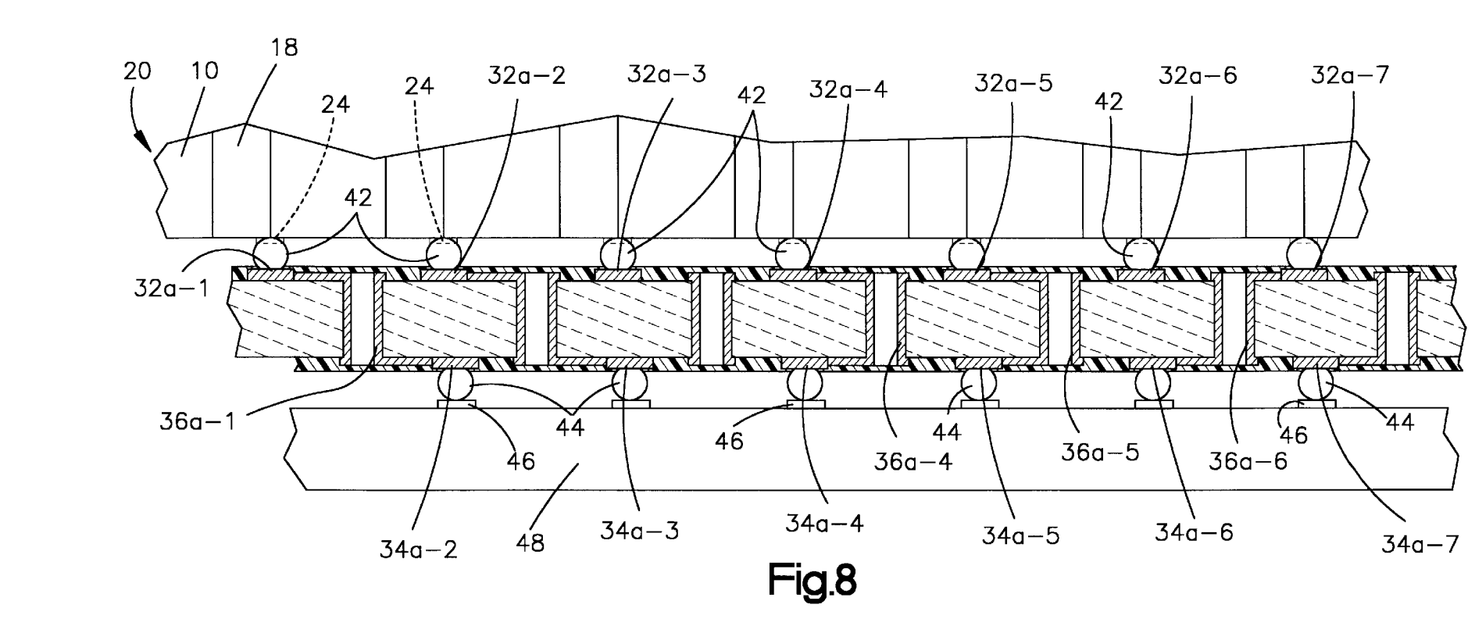
FIG. 8 is a sectional view taken through a portion of an interposer and portions of the chip stack showing a technique of chip shifting to provide connection.

FIG. 8 is a sectional view through connections 32a-1, 32a-2, 32a-3, 32a-4, 32a-5, 32a-6 and 32a-7 and pads 34a-1, 34a-2, 34a-3, 34a-4, 34a-5, 34a-6 and 34a-7 in connecting a chip stack 20 to a substrate utilizing a technique known as chip shifting. Wiring in the channel is not required in this technique. This also depicts the connection of the chip cube 20 to the pads 32 by means of solder balls 42 and the connection of the pads 34 by solder balls 44 to pads 46 on a substrate 48. In this case, pad 32a-1 is connected through via 36a-1 to pad 34a-2; pad 32a-2 is connected through via 36a-2 to pad 34a-3; pad 32a-3 is not connected to any pad; pad 32a-4 is connected through via 36a-4 to pad 34a-4; pad 32a-5 is connected through via 36a-5 to pad 34a-5; pad 32a-6 is not connected to any pad; and pad 32a-7 is connected through via 36a-6 to pad 34a-6. Thus, the result is chip shifting, wherein a chip can be connected to a pad directly beneath or within one of the pads. With the technique shown in FIG. 8, the connection of the chips can be shifted one position either left or right without the need to use any channels on the surface of the interposer for wiring. Chip shifting can be used instead of or in combination with the surface wiring as shown in FIGS. 6 and 7.

It will thus be appreciated with the embodiments of the invention shown in FIGS. 1–8 once a chip stack 20 has been formed, the chips tested, and it determined that there are a sufficient number of functioning chips available, the interposer can be custom-wired to connect with those functioning chips, wherever they are located in the stack, and provide the necessary footprint on the output. To this end, the interposer could be partially formed and maintained in stock, i.e., the pads 32 and 34 on both sides and the vias 36 formed in the interposer without connections using standard photolithographic and metalization processing. Once the pattern of functioning chips has been determined, the necessary connections can be formed, again using standard photolithographic techniques. Alternatively, the interposer can be formed starting with the dielectric material as a blank and forming all of the pads, vias and interconnections after the determination has been made as to which chips are to be functional and which chips are non-functional chips. In this way, the entire stack of chips need not be scrapped due to the lack of functioning of a single connection. A standard footprint can be used, and only a single part or a very limited number of parts need be stored through the interposer, with the customization being done quickly and rapidly once the determination has been made as to which chips are functional in the stack.

Another alternative is that the interposer can be formed with all of the holes drilled, and plated with copper, and all circuit-receiving surfaces blanket plated with copper. After the determination of which chips are to be used as good chips, the required pads and interconnections are defined by subtractive etching. Both additive and subtractive circuitizations describe sequence custom art work.

Another technology that can be used is laser direct write lithography to customize the part by either additive or substractive processes.

Figure 9:
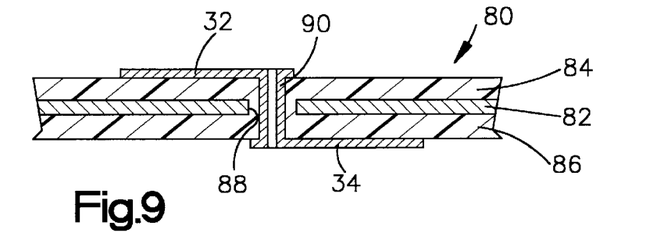
FIG. 9 is a longitudinal sectional view of a portion of another embodiment of an interposer.

Referring now to FIG. 9, a longitudinal sectional view of a portion of another embodiment of an interposer according to this invention is shown. This embodiment is particularly useful to accommodate differences in the coefficient of thermal expansion (CTE) of components. In particular, it is useful in accommodating the differences in the CTE of a chip stack in different directions; i.e., in the direction transverse to the chip in the stack as compared to the direction longitudinal to the chips, which, as is well known, is different. The interposer designated by the reference character 80 is comprised of a sheet of metal 82 laminated between a pair of silica filled polytetrafluoroethylene (PTFE) sheets 84, 86. Holes 88 are pre-formed in the plate 82 where vias 90 are to be formed. The lamination of the sheets 84 and 86 under heat and pressure causes the PTFE material therefrom to fill the holes 88 during lamination. The vias 90 are then formed, and the interposer circuitized, including top surface metallurgy 32, bottom surface metallurgy 34, and plated through holes 36 are formed in a conventional manner. The metal sheet 82 is selected such that it, together with the PTFE material, provides a composite CTE of the desired value. For example, the metal could be copper, or invar or copper-clad invar (CIC). Typically, the composite CTE of the interposer 80 is selected to be about 10 ppm/° C. for a chip stack, although other values could be selected depending upon well-known design considerations.

Other techniques of controlling the CTE can be used, such as the selection of the dielectric material for the interposer, either with or without the use of a metal sheet.

Figure 10:
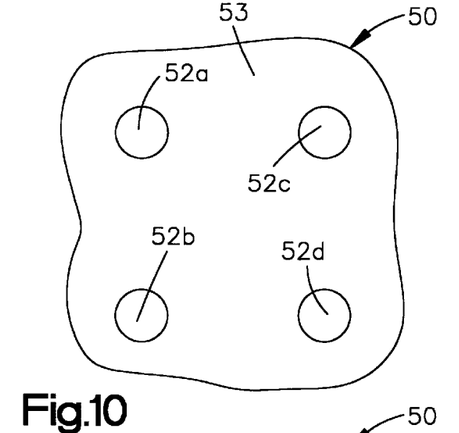
FIG. 10 is a top plan view of an interposer before personalization for use in correcting wiring defects in a single IC chip.
Figure 11:
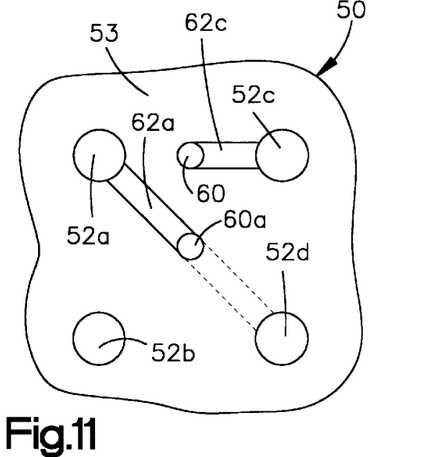
FIG. 11 is a view similar to FIG. 10 of the interposer after personalization to correct a particular wiring defect.
Figure 12:
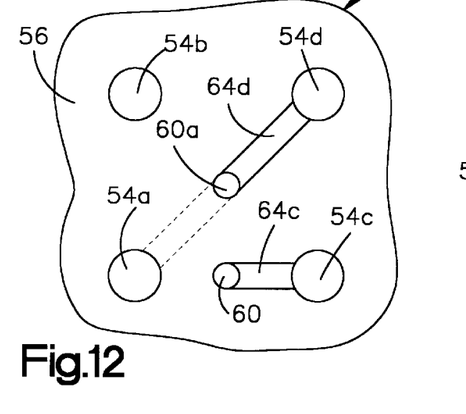
FIG. 12 is a bottom plan view of the interposer of FIG. 11.
Figure 13:
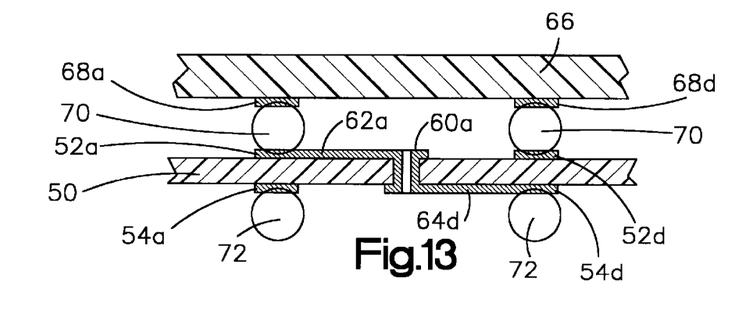
FIG. 13 is a sectional view of a portion of an IC chip mounted on the interposer of FIGS. 11 and 12 showing correction of wiring on a chip.
Figure 14:
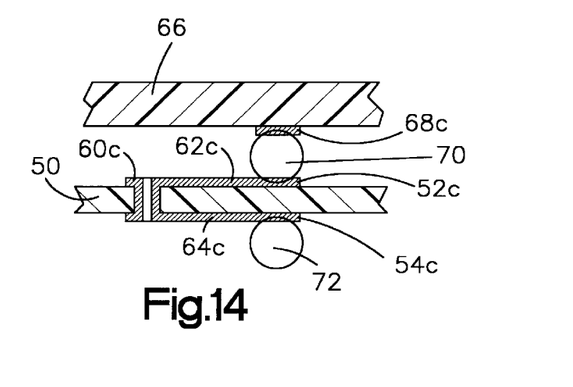
FIG. 14 is a view similar to FIG. 13 showing the wiring of a contact on a chip that is correct.

Referring now to FIGS. 10–14, another embodiment of the present invention is shown which is particularly useful in correcting wiring mistakes on individual IC chips such as those chips which are prototype chips in design stage which need to be tested. The use of the interposer allows for re-wiring of the chip once the wiring mistake has been determined, which allows for testing the chip rather than requiring the fabrication of the chip to be started over again. FIG. 10 shows a top plan view of a very small portion of an interposer 50 having a series of pads, four of which 52a, 52b, 52c and 52d are shown, on chip mounting surface 53 of the interposer which are designed and positioned to mate with four pads on an IC chip. In the illustrated embodiment, it will be assumed that the IC chip has been mistakenly wired, and that the connection on the chip corresponding to pad 52a should have been made to connection on the chip corresponding the pad 52d, but that connection corresponding to pad 52c is correct, and pad 52b is a dummy. In order correct this, four pads 54a, 54b, 54c and 54d are provided on the opposite surface 56 of the interposer as shown in FIG. 12. The wiring connection can then be made by providing a via or plated through hole 60a and connecting pad 52a to the plated through hole 60a by top surface metallurgy 62a (FIG. 11) and connecting the pad 54d to the plated through hole 60a by bottom surface metallurgy 64d (FIG. 12). This, in effect, provides the signal connection at pad 52a at the outlet 54d, which corresponds in position to where it was intended to be with respect to the chip. A cross-section of this is shown in FIG. 13 where an IC chip 66, having pads 68a and 68d thereon corresponding to pads 52 are provided which are attached by solder connections 70 to the pads 52a and 52d and solder ball connections 72 are provided attached to the pads 54a and 54d to connect to the substrate or other fixture being used to test the chip. Thus, chip pad 68a is connected to the substrate through pad 54d to correct the wiring mistakes. In this way, wiring corrections on chips under test and being designed can be made without necessitating the entire remanufacture of a chip. Since the wiring of the chip corresponding to pad 52c is correct, pad 52c is connected to via 60c by top surface metallurgy 62c (FIG. 11) and via 60c to pad 54c by bottom surface metallurgy 64c. A cross-section of this is shown in FIG. 14. Thus, correctly wired chip connections and incorrectly wired connections can all be made without the need to remanufacture the chip.

Once the tests have been satisfactorily performed and the proper wiring determined, the chip can then be redesigned in final form for production purposes. Of course, this is merely a simple representation of one type of correction that can be made. Other more complex corrections can also be made.

Accordingly, the preferred embodiments of the present invention have been described. With the foregoing description in mind, however, it is understood that this description is made only by way of example, that the invention is not limited to the particular embodiments described herein, and that various rearrangements, modifications, and substitutions may be implemented without departing from the true spirit of the invention as hereinafter claimed.

What is claimed is:

1. An IC chip assembly comprising, an integrated circuit chip having an array of connectors thereon in a given pattern, at least some of which connectors are in an unwanted configuration, an interposer, said interposer having a metal sheet with an organic dielectric material disposed on both sides thereon and having a chip connection surface and an output surface, a first set of connection pads on said chip connection surface arranged in said given pattern, a second set of connection pads on said output surface arranged in said given pattern, conducting vias extending from said chip connection surface to said output surface, the connectors on said IC chip being directly connected to said first set of connection pads, conducting circuitry on said surfaces of said interposer to convert said unwanted configuration of said connection pads on said IC chip to a wanted configuration of said second set of connection pads.

2. The structure as defined in claim 1 wherein at least some of said connectors thereon are in a wanted configuration, and said connectors in said wanted configuration are wired to pads on said second set of contacts in said wanted configuration.

3. The invention as defined in claim 1 wherein the said sheet of metal is selected from the group of copper, invar and copper-clad invar.

4. The invention as defined in claim 1 wherein the sheet of metal is copper.

5. The invention as defined in claim 1 wherein the sheet of metal is invar.

6. The invention as defined in claim 1 wherein the sheet of metal is copper-clad invar.

7. A method of correcting the wiring connection to connectors in a given array pattern on an IC chip wherein at least two of said connectors are incorrectly wired, comprising the steps of;

providing an interposer having a metal sheet with an organic dielectric material disposed on both sides thereon and defining a chip connection surface and an output surface, a first set of connection pads on said chip connection surface arranged in said given pattern, a second set of connection pads on said output surface arranged in said given pattern, conducting vias extending from said connection surface to said output surface, connecting said circuitry on said surfaces of said interposer to convert said configuration of said connection pads on said chip connection surface, including the connection pads on the chip, corresponding to the incorrectly wired connection to correctly wired pads of said second set of connection pads; and connecting the connectors on said IC chip directly to the first set of connection pads.

8. The invention as defined in claim 7 wherein the said sheet of metal is selected from the group of copper, invar and copper-clad invar.

9. The invention as defined in claim 7 wherein the sheet of metal is copper.

10. The invention as defined in claim 7 wherein the sheet of metal is invar.

11. The invention as defined in claim 7 wherein the sheet of metal is copper-clad invar.

* * * * *